(12) United States Patent
Ha et al.

(10) Patent No.: US 10,488,475 B2
(45) Date of Patent: Nov. 26, 2019

(54) TRANSCEIVER COIL ARRAY FACILITATING MR-GUIDED PROCEDURES

(71) Applicant: IMRIS, Inc., Minnetonka, MN (US)

(72) Inventors: Seunghoon Ha, Eden Prairie, MN (US); Haoqin Zhu, Eden Prairie, MN (US); Labros Petropoulos, Maple Grove, MN (US); Meir Dahan, St. Louis Park, MN (US)

(73) Assignee: IMRIS, Inc., Minnetonka, MN (US)

( * ) Notice: Subject to any disclaimer, the term of this patent is extended or adjusted under 35 U.S.C. 154(b) by 1148 days.

(21) Appl. No.: 14/677,700

(22) Filed: Apr. 2, 2015

(65) Prior Publication Data
US 2016/0291100 A1 Oct. 6, 2016

(51) Int. Cl.
*G01R 33/36* (2006.01)

(52) U.S. Cl.
CPC ...... *G01R 33/3607* (2013.01); *G01R 33/3664* (2013.01)

(58) Field of Classification Search
CPC ............. G01R 33/4828; G01R 33/543; G01R 33/5608; G01R 33/50; G01R 33/5611; G01R 33/34046; G01R 33/3607
USPC ........................................................ 324/318
See application file for complete search history.

(56) References Cited

U.S. PATENT DOCUMENTS

| | | | |
|---|---|---|---|
| 5,735,278 A * | 4/1998 | Hoult | A61B 6/0485 324/318 |
| 6,163,240 A * | 12/2000 | Zuk | G01R 33/3806 324/318 |
| 6,374,132 B1 * | 4/2002 | Acker | A61B 5/055 324/307 |
| 7,619,413 B2 | 11/2009 | Wiggins | |
| 8,138,762 B2 | 3/2012 | Zhu et al. | |
| 8,406,853 B2 | 3/2013 | Petropoulos | |
| 8,487,615 B2 | 7/2013 | Zhu et al. | |
| 8,604,789 B2 | 12/2013 | Shvartsberg et al. | |
| 8,797,029 B2 | 8/2014 | Zhu et al. | |

(Continued)

OTHER PUBLICATIONS

Harvey, Paul R., et al., "MultiTransmit parallel RFtransmission technology", (Aug. 10, 2010), 16 pgs.
Zhou, Anqi, "RF Coils in MRI", (May 19, 2006), 33 pgs.

*Primary Examiner* — Christopher P McAndrew
(74) *Attorney, Agent, or Firm* — Schwegman Lundberg & Woessner, P.A.

(57) ABSTRACT

Nuclear magnetic resonance (MR) imaging can include use of an electrical transceiver coil system comprising an array of segmented loops. The array can be arranged about a portion of an imaging subject and arranged to provide surgical access to a region of the imaging subject from at least one direction. The segmented loops can establish a volumetric radio frequency (RF) excitation field across a volume-of-interest associated with the imaging subject in response to the segmented loops receiving specified transmit phases providing a non-90-degree relative phase between segmented coil loops at adjacent ones of the segmented loops. All or at least some of the segmented loops can provide outputs indicative of an RF signal from the imaging subject, the RF signal elicited in response to RF excitation. The transceiver coil system can facilitate pre-operative, intra-operative, or post-operative MR imaging, such as facilitating access for a surgical procedure.

28 Claims, 11 Drawing Sheets

(56) References Cited

U.S. PATENT DOCUMENTS

| | | | | |
|---|---|---|---|---|
| 2002/0118066 | A1* | 8/2002 | Lautzenhiser | H03F 1/301 330/295 |
| 2003/0201775 | A1* | 10/2003 | Boskamp | G01R 33/34046 324/318 |
| 2008/0039904 | A1* | 2/2008 | Bulkes | A61N 1/3622 607/62 |
| 2008/0042067 | A1* | 2/2008 | Rousso | A61B 5/417 250/363.04 |
| 2008/0243239 | A1* | 10/2008 | Dancu | G09B 23/28 623/1.41 |
| 2008/0306377 | A1* | 12/2008 | Piron | A61B 8/0825 600/422 |
| 2010/0296723 | A1* | 11/2010 | Greer | A61B 5/064 382/153 |
| 2012/0112748 | A1* | 5/2012 | Hetherington | G01R 33/34007 324/318 |

* cited by examiner

US 10,488,475 B2

TRANSCEIVER COIL ARRAY FACILITATING MR-GUIDED PROCEDURES

BACKGROUND

Techniques involving nuclear magnetic resonance (NMR) have been widely adopted for use in applications such as spectroscopy and medical diagnosis. Nuclear magnetic resonance imaging (MRI) is widely used such as for imaging of the head, neck, abdomen, or extremities of an imaging subject. Generally, an MRI system includes a powerful bias magnet arranged to induce a static magnetic field along a specified axial direction. Gradients in the magnetic field can be induced as a function of spatial position to facilitate spatial localization of received signals. A spin axis of protons within the species being interrogated aligns with the applied field. A radio-frequency (RF) pulse is generally used to perturb the net spin polarization of the protons in a manner causing precession back to a state aligned with the applied magnetic field. Relaxation of the perturbed protons can be detected via coupling to a tuned RF receiving loop (e.g., a "receive coil"). In one approach, transmission of the RF pulse can be accomplished using one or more loop structures (e.g., a "transmit RF coil") located in the same housing as the bias magnet. Such a transmit RF coil located in or nearby a housing of the bias magnet can be referred to as a "built-in body coil."

OVERVIEW

Nuclear magnetic resonance imaging can include use of one or more RF receiving coils located in close proximity to an imaging subject (or even located within an imaging subject, such as in relation to gastrointestinal imaging). Such receive coils can be referred to as a "portable" coils. For example, for surface imaging, a receive-only coil assembly can be located nearby an area of interest to be imaged. A region of magnetic field uniformity for such surface coils is generally constrained to a localized area nearby the receive coil assembly. In such a scheme, transmission of RF pulses is performed using a separate transmit coil or coil array located in or nearby the housing for the bias magnet.

For volumetric imaging, various receive coil arrangements can be used. An array of loops can be used, such as coupled to respective receive channel amplifiers and digitizers to support parallel imaging techniques. Again, such receive coil configurations can detect an RF signal elicited by an RF excitation, with such excitation generally provided from a separate transmit coil.

In one approach, a transmit-only coil can be located nearby the imaging subject, instead of (or in addition to) using transmit coil arrangements located further away from the imaging subject. Coil arrangements can include loop structures arranged to "saddle" a portion or an entirety of the imaging subject when placed nearby the imaging subject. In another example, a "birdcage" transmit coil structure can be used that entirely encircles lateral, anterior, and posterior portions of the imaging subject. Such a birdcage structure can provide a relatively uniform and radially symmetric RF excitation field. However, the present inventors have recognized, among other things, that such a birdcage structure generally precludes surgical access to portions of the imaging subject without requiring removal or repositioning of the coil structure.

The present inventors have also recognized, among other things, that an imaging coil arrangement can be provided to operate both as an RF transmitter (e.g., to deliver RF pulse sequences for MRI imaging) and an RF receiver (e.g., to receive signals elicited by RF pulse sequences), while providing access for a variety of diagnostic or therapeutic procedures and while maintaining integrity of a sterile field. Such a "transceiver" coil arrangement providing access can facilitate magnetic-resonance-guided (MR-guided) procedures including stereotactic surgery, including radiotherapy, laser ablation, or robotic-assisted surgical procedures such as neurosurgery. A transceiver coil arrangement as described herein can allow navigation to a surgical access site without requiring repositioning or the removal of the transceiver coil arrangement, preserving the sterile field and facilitating imaging before, during, or after surgery. One or more of the imaging subject or a large bias magnet can be repositionable, such as moved into and out of position as needed for imaging, while the transceiver coil can remain in place nearby the imaging subject, such as within the sterile field. In an example, a transceiver coil arrangement as described herein can be sized and shaped to facilitate access to a cranial region of an imaging subject to enable positioning, placement, and fixation of the cranial region to a head fixation device (HFD) or other fixture.

In an example, an electrical transceiver coil system can include an array of segmented loops, the array arranged about at least a portion of a nuclear magnetic resonance imaging subject, the array of segmented loops arranged to provide surgical access to a region of the imaging subject from at least one direction, such as from a direction opposite at least a portion of the array of segmented loops. The segmented loops can be configured to establish a volumetric radio frequency (RF) excitation field across a volume-of-interest associated with the imaging subject in response to the segmented loops receiving specified transmit phases providing a non-90-degree relative phase between segmented coil loops at adjacent ones of the segmented loops. At least some of the segmented loops are configured to provide outputs indicative of an RF signal from the imaging subject, the RF signal elicited in response to RF excitation.

This overview is intended to provide an overview of subject matter of the present patent application. It is not intended to provide an exclusive or exhaustive explanation of the invention. The detailed description is included to provide further information about the present patent application.

Figure 1A:
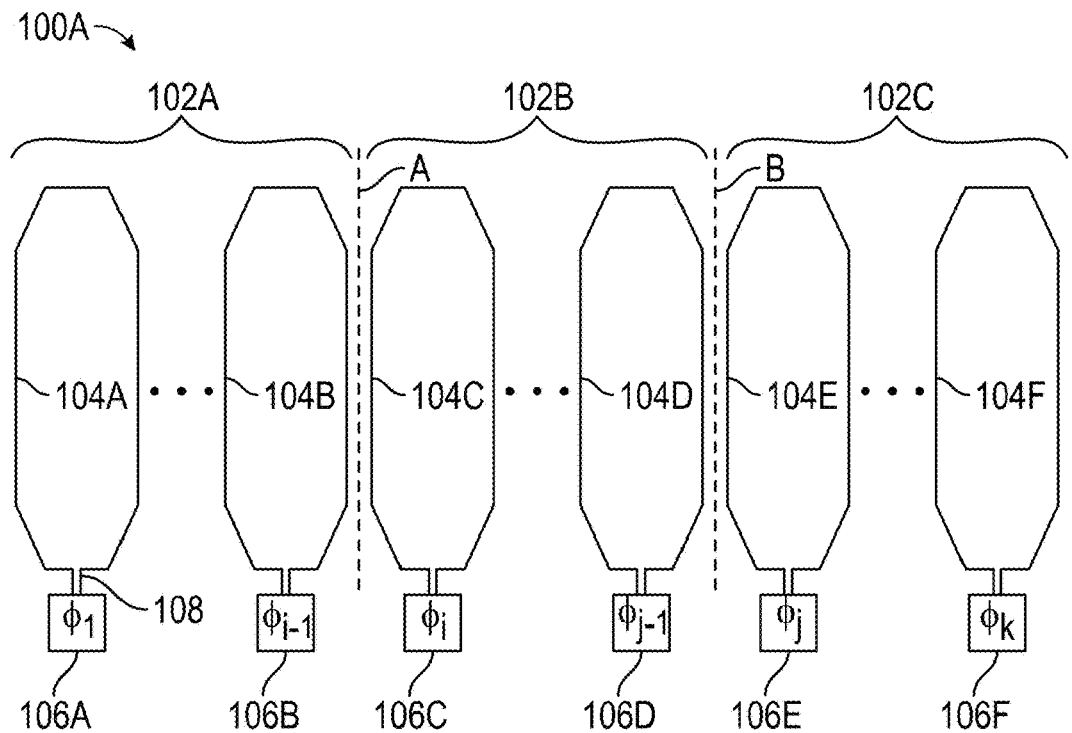
FIG. 1A illustrates generally an example that can include an array of electrical loop structures such as can be fed using specified phases and such as can be arranged about an imaging subject.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

FIG. 1A illustrates generally an example that can include an array 100A of electrical loop structures 104A, 104B, 104C, 104D, 104E, and 104F, such as can be fed using specified transmit phases from transmit sources 106A, 106B, 106C, 106D, 106E, and 106F. The frequencies and phases of the signals provided by the transmit sources 106A, 106B, 106C, 106D, 106E, and 106F can include radio frequency (RF) signals, such as pulsed RF signals transmitted in relation to a nuclear magnetic resonance (MR) imaging protocol. The array 100A is shown as planar in the view of FIG. 1A, however the array can be arranged about multiple sides of at least a portion of an MR imaging subject, such as including bends or folds about the axes A and B as shown in FIG. 1A.

Use of the phrase "loop" need not imply or require a conductively closed electrical loop, but can instead generally refer to an electrical structure where an injected current, such as provided at a feed location 108, can establish a magnetic field that can be coupled to an imaging volume-of-interest to perturb the net spin polarization of the nuclei within the volume-of-interest, or a magnetic field elicited from the volume-of-interest can be coupled to the electrical structure and can induce a detectable signal (e.g., an induced electromotive force or current induced from the electromotive force). In a transceiver example, a received signal can be coupled to other circuitry at the same feed location 108 as the transmit signal, the received signal can be obtained from a port located elsewhere along a loop. As shown and described in other examples herein, a transmit/receive (T/R) switch can be included at or near the feed location 108, such as to isolate a sensitive receiver pre-amplifier from potentially damaging or desensitizing signal levels during transmission.

The transmit phases provided by the transmit sources 106A through 106F can be specified to provide an RF excitation field within a volume-of-interest, where the RF excitation field includes a specified uniformity within the volume-of-interest. Relative phases between laterally adjacent coils (e.g., $\phi_i$ and $\phi_{i-1}$ corresponding to loops 104C and 104B or $\phi_j$ and $\phi_{j-1}$ corresponding to loops 106E and 106D) can be specified to have values other than ninety degrees (e.g., adjacent loops can be fed using transmit phases that are different by non-90-degree increments). Accordingly, in concert, the phases provided to each of the transmit coils can contribute to establishing a uniform RF excitation field (e.g., a $B_1$ field) in a volume-of-interest being imaged.

Figure 1B:
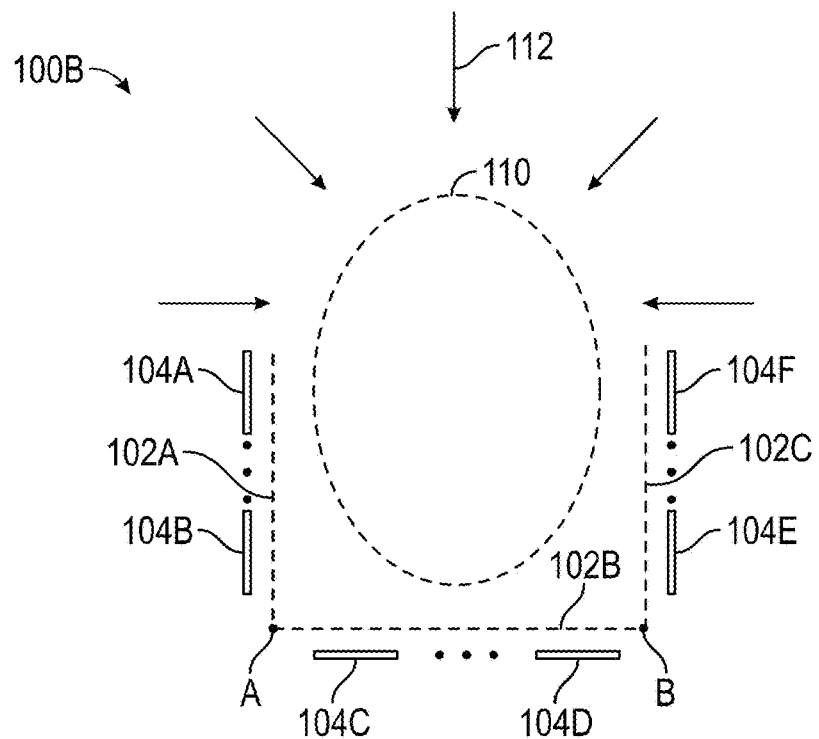
FIG. 1B illustrates generally another view of the example of the electrical loop structures of FIG. 1A, such as arranged about an imaging subject, including permitting access to the imaging subject from at least one direction.

Groups of loops can be arranged in a plane or substantially in a plane such as shown by a first group arranged nearby a first side 102A of the imaging subject, a second group arranged nearby a second side 102B of the imaging subject, and a third group 102C arranged nearby a third side of the imaging subject, as shown illustratively in FIG. 1B. However, the loops need not be planar, and can include other shapes such as cupped or domed shapes, such as sized and shaped to conform to one or more anatomical features of an imaging subject or otherwise arranged to avoid mechanical interference with other apparatus such as surgical apparatus. One or more portions of the array 100A can be deformable or flexible, such as to facilitate repositioning or arranging the array 100A in proximity to other fixtures, such as a head fixation device (HFD). Accordingly, the array 100B can be arranged about a portion of an imaging subject without requiring loop structures to be perfectly planar or arranged exactly parallel to the sides. For example, FIG. 2B and FIG. 6B illustrate generally examples including loop arrays arranged about three sides of an imaging subject without requiring each loop to be aligned with one of a lateral, anterior, or posterior plane of the imaging subject.

As shown and described in other examples herein, one or more of the loops 104A through 104F can each be coupled to a receive channel, such as to provide an RF signal received from the volume interest, where the RF signal was elicited by one or more RF excitation signals provided by the array 100A or provided by a separate RF transmit coil. Where multiple coils are used for receiving RF signals, parallel imaging techniques (e.g., using one or more of image-space or k-space signal representations) can be used for processing the resulting signals using the array 100A as a phased array receive structure. One or more of the loops 104A through 104F can include serial capacitors, such as to suppress or block currents at frequencies corresponding to applied gradient fields while still establishing or permitting resonance at or near frequencies of interest during receiving (e.g., such as a resonance at or near a Larmor frequency).

FIG. 1B illustrates generally another view of the example of the electrical loop structures 100B of FIG. 1A, such as arranged about three sides of at least a portion of an imaging subject 110, including permitting access to a fourth side of the imaging subject. In the example of FIG. 1B, the imaging subject 110 can include a head region. For example, a first side 102A and a third side 102C of the imaging subject 110 can include lateral regions of the imaging subject. A second side 102B can include one of a posterior region (e.g., where the imaging subject 110 is lying face-up) or an anterior region (e.g., where the imaging subject 110 is lying facedown). The array 100B can be folded about the axes A and B as mentioned in relation to FIG. 1A, above.

Because the array 100B can be generally "U"-shaped in cross section as shown in FIG. 1B and does not completely encircle the imaging subject 110, access is preserved such as in the regions indicated by the arrows. For example, surgical access to sides on a fourth side of the imaging subject 110 can be generally un-restricted, such as in a direction toward a region indicated by the arrow 112. Individual loops in the array, such as the loops 104A, 104B, 104C, 104D, 104E, and 104E can be placed nearby the imaging subject 110, such as within or nearby a sterile field (e.g., under surgical drapes), where the sterile field includes a region where a surgical or diagnostic procedure is to be performed. A head fixation device (HFD) or other apparatus can be coupled to the imaging subject 110, such as with the array 110B nested within the HFD or other apparatus.

The phases between certain specified laterally adjacent loops can be the same. For example, in the first group of loops 104A through 104B located on the first side 102A of the imaging subject (e.g., a first lateral side), a phase value commonly shared amongst the first group can be used (e.g., each loop can be driven using the same relative phase). Similarly, a different transmit phase can be used for the second group of loops 104C through 104D located on the second side of the imaging subject (e.g., a posterior or anterior side), and yet a third different transmit phase can be used for the third group of loops 104E through 104F located on the third side (e.g., a second lateral side) of the imaging subject.

As mentioned above, the present inventors have recognized, among other things, that an imaging coil arrangement can be provided to operate both as an RF transmitter (e.g., to deliver RF pulse sequences for MR imaging) and an RF receiver (e.g., to receive signals elicited by RF pulse sequences) as an element of an MR imaging system, while providing access for a variety of diagnostic or therapeutic procedures and while maintaining integrity of a sterile field. The system can include a powerful bias magnet (e.g., configured to establish a $B_0$ field having a flux density of 1.5 Tesla (T), 3 T or other value), such as a repositionable bias magnet, one or more gradient field generation coils, circuitry to monitor and drive the gradient field generation coils, along with any portable or built-in RF coils, and processing equipment to control and perform an imaging protocol, including digitizing, analyzing, and storing imaging information.

Use of a portable or body-located "transceiver" coil arrangement as described herein can facilitate magnetic-resonance-guided (MR-guided) procedures including stereotactic surgery such as can include radiotherapy or robotic-assisted surgical procedures including neurosurgery, for example. A transceiver coil arrangement as described herein can allow navigation to a surgical access site without requiring repositioning or the removal of the transceiver coil arrangement, preserving the sterile field and facilitating imaging before, during, or after surgery. For example, the large bias magnet mentioned above can be repositionable, such as moved into and out of position as needed for imaging, while the transceiver coil can remain in place within the sterile field. In an example, a transceiver coil arrangement as described herein can provide compatibility with or permit access to a cranial region of an imaging subject to enable positioning, placement, and fixation of the cranial region to a head fixation device (HFD) or other fixture, without requiring the transceiver coil to be removed.

The present inventors have also recognized, among other things, that use of a loop array 100B such as shown illustratively in FIG. 1B allows a localized, uniform volumetric RF excitation field to be transmitted, without entirely encircling the imaging subject 110, with the localized field having a desired homogeneity. In this manner, the field strength can be significantly attenuated in regions nearby or including surgical apparatus such as a surgical robot or stereotactic fixture, approaching the imaging subject from the direction indicated by the arrows (such as the arrow 112). Localization of the RF excitation field can also help to control specific absorption ratio (SAR), such as limiting a dose of RF energy to which the imaging subject is exposed while still providing sufficient field strength and uniformity for volumetric MR imaging.

Figure 2A:
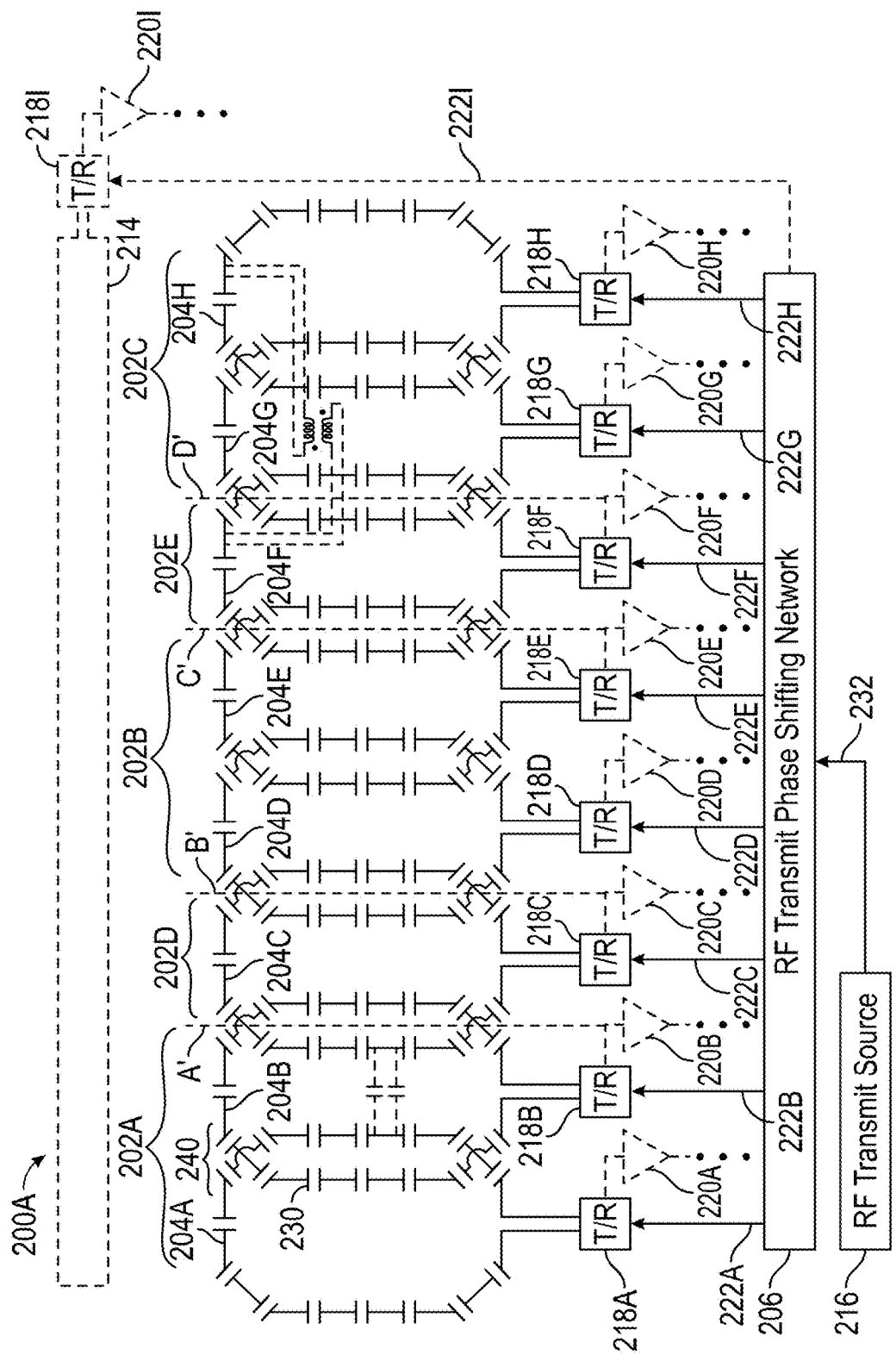
FIG. 2A illustrates generally an example of a transceiver coil arrangement that can include an array of eight segmented electrical loop structures, such as can be coupled to an RF transmit source using an RF transmit phase shifting network.
Figure 2B:
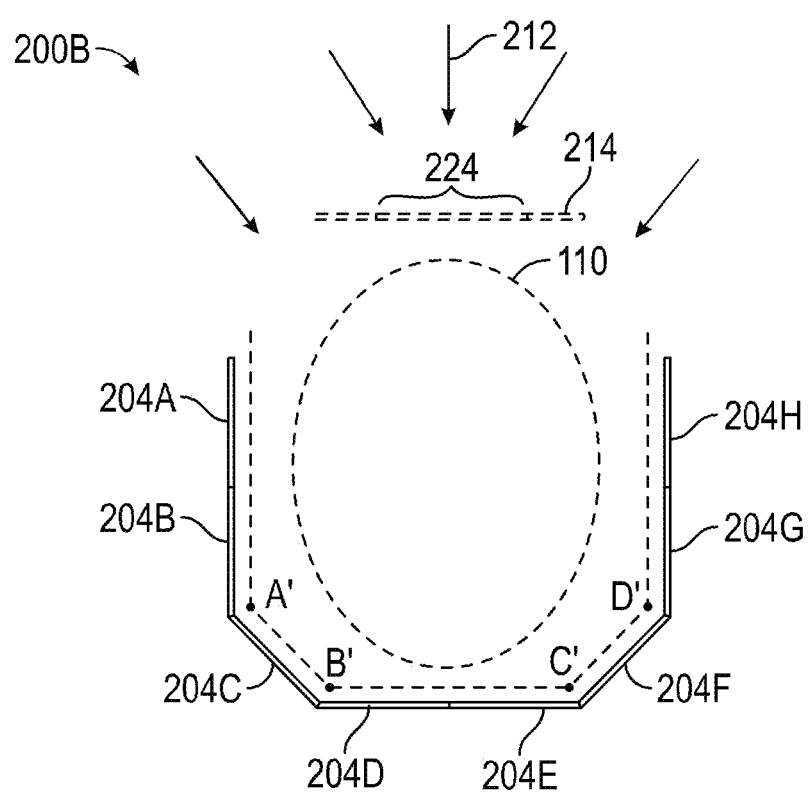
FIG. 2B illustrates generally another view of transceiver coil arrangement of the example of FIG. 2A, along with a separate coil assembly that can be optionally included.

FIG. 2A illustrates generally an example of a transceiver coil arrangement that can include an array 200A of eight segmented electrical loop structures 204A, 204B, 204C, 204D, 204E, 204F, 204G, and 204H, such as can be coupled to an RF transmit source 216 (e.g., an RF power amplifier) using an RF transmit phase shifting network 206. Inputs 222A, 222B, 222C, 222D, 222E, 222F, 222G and 222H to the loop structures 204A, 204B, 204C, 204D, 204E, 204F, 204G, and 204H from the RF transmit phase shifting network 206 can have specified phases, such as to establish a $B_1$ field having a specified uniformity in a volume-of-interest within the imaging subject using the segmented electrical loop structures 204A through 204H. The use of eight segmented loop structures 204A through 204H in FIG. 2A or FIG. 2B, or other examples herein, is illustrative and other numbers of loop structures can be used.

The array 200A of FIG. 2A illustrates generally that adjacent loop structures such as loops 204A and 204B can at least partially laterally overlap. Such overlap can be used to decouple adjacent coils, such as through flux cancellation. Other decoupling techniques can be used, such as using one or more segments (e.g., "legs") commonly shared amongst two or more loops. The loops need not be adjacent to use such capacitive decoupling techniques. For example, capacitive decoupling can be used for decoupling between a loop (e.g., first loop 204A) and a next-adjacent loop (e.g., third loop 204C), for example. Inductive decoupling can also be used, such as shown between a loop (e.g., eighth loop 204H) and a next-adjacent loop (e.g., sixth loop 204F). Serial capacitors such as a capacitor 230 can be included between adjacent loop segments, such as to block or attenuate currents outside of a frequency range of interest. As mentioned in relation to the examples of FIGS. 1A and 1B, one or more of the segmented loop structures 204A through 204H can be used as a receive coil (e.g., all of the loop structures 204A through 204H can be used as receive structures, or a subset of the loop structures 204A through 204H can be used, or even separate coils can be used in addition or instead of the loop structures 204A through 204H, according to various examples). When one or more of the loops structures 204A through 204H are used as receive coils, each receive coil can include a port coupled to a transmit/receive (T/R) switch, such as one or more T/R switches 218A, 218B, 218C, 218D, 218E, 218F, 218G, or 218H as shown illustratively in FIG. 2A.

The T/R switches can include passively or actively-powered circuits. For example, the T/R switches can include a PIN diode biased during transmission to block coupling of high power transmit signals from the RF transmit phase shifting network 206 to sensitive receive-chain circuitry such as can include one or more RF pre-amplifiers 220A, 220B, 220C, 220D, 220E, 220F, 220G, or 220H (e.g., one or more low-noise amplifiers (LNAs)). Other techniques can be used to prevent overstressing or desensitizing the receive signal chains, such as using actively-powered or passively-powered detuning circuits coupled to one or more of the loops 204A through 204H when the loops 204A through 204H are used as receive coils. As mentioned above, when a group of loops amongst the segmented loops 204A through 204H are used as receive coils, the group of receive loops can be used as a phased array receive structure, such as to enable use of parallel imaging techniques. In an example, a group of receive loops can include loops not used for transmitting (e.g., a group of receive loops can be a superset of the transmit loops or an entirely separate array, such as including one or more loops having a structure or shape different from the loops 204A through 204H).

As in the examples of FIGS. 1A and 1B, the array 200A is shown in planar form in FIG. 2A but can be bent or folded about various axes, such as the axes A', B', C', and D'. In this manner, the array 200A can be arranged about an MR imaging subject to provide an RF excitation field. For example, the first and second loops 204A and 204B can be located in a first region 202A, the fourth and fifth loops 204D and 204E can be located in a second region 202B, and the seventh and eighth loops 204G and 204H can be located in a third region 202C. The first and third regions 202A and 202C can correspond to lateral sides of an imaging subject 110, and the second region 202B can correspond to one of an anterior or posterior region of the imaging subject, as shown illustratively in FIG. 2B. Transitions between the regions 202A to 202B, or 202B to 202C can include one or more loops, such as a third loop 204C located in a fourth region 202D, or a sixth loop 204F located in a fifth region 202E.

FIG. 2A also illustrates generally a separate assembly 214 that can include a loop separate from the array 200A. The separate assembly 214 can include a passively-coupled (e.g., wirelessly excited) loop that is inductively excited during transmission by the other loops 204A through 204H, such as to enhance volumetric $B_1$ field uniformity. The separate assembly 214 can be located in a region separate from the array of loops 204A through 204H, such as shown illustratively in FIG. 2B or shown and described in relation to the example of FIG. 4A and FIG. 4B. In another example, the separate assembly 214 can include a wired connection to other portions of an MR imaging system, such as to receive a signal to be transmitted via a feed line 222, or to provide a received signal to am RF pre-amplifier 220I, such as using a T/R switch 218I to protect the receive chain as described in other examples.

FIG. 2B illustrates generally another view of transceiver coil arrangement 200B of the example of FIG. 2A, along with a separate coil assembly 214 that can be optionally included. As in relation to the example of FIG. 1B, in FIG. 2B, a portion of an imaging subject 110 can include a head (e.g., shown axially). The arrangement 200B of the transceiver coils includes a piecewise arrangement of eight segmented electrical loops 204A, 204B, 204C, 204D, 204E, 204F, 204G, and 204H arranged about the imaging subject (e.g., about the lateral sides and about one of an anterior or posterior side depending as mentioned in relation to the example of FIG. 1B). While the arrangement 200B in FIG. 2B is shown illustratively as a piece-wise linear arrangement of planar coils, a continuously-curved arrangement, or an arrangement including compound curves (e.g., including curves in two or more axis such as to provide a cupped or domed configuration) can be located about the imaging subject 110, such as having a cross section similar to the "U"-shaped configuration shown in FIG. 2B. In this manner, surgical access is provided in the direction indicated by the arrows in the region opposite the loop arrangement 200B.

The separate assembly 214 can be positionable over the imaging subject in a region opposite the array of loops 204A through 204H, such as over or nearby a region of the imaging subject 110 opposite at least a portion of the array. The separate assembly 214 can be flexible, such as padded, such as to rest upon the imaging subject or upon other apparatus coupled to the imaging subject. The separate assembly 214 can be sterile, such as disposable or can be configured for compatibility for sterilization equipment. In this manner, the separate assembly 214 can be introduced into the sterile field, or located nearby the sterile filed without introducing infection risk.

In an example, the separate assembly 214 can include an aperture 224, such as to permit surgical access to the imaging subject 110 in a direction indicated by the arrow 212 through the aperture 224. For example, the aperture can have an area of about 100 square centimeters, such as comprising a square, rectangular, or circular aperture. In other examples, the aperture can have other shapes or areas. Illustrative examples of operational frequencies and loop size and shape are provided below in relation to FIG. 4A and FIG. 4B, and corresponding simulation models showing normalized B1 field magnitudes and SAR estimates are provided in FIGS. 5A, 5B, 5C, 5D, 5E, and 5F, including configurations where a separate coil assembly similar to the coil assembly 214 is present or absent. If an imaging volume-of-interest is located nearby the array of coils 204A through 204H, the separate assembly 214 may not be needed to achieve a specified transmit RF excitation field uniformity.

In an illustrative example, the relative phases used to drive each of the segmented loops 204A through 204H can include 0-degree phases for the first and second loops 204A and 204B, a 45-degree phase for the third loop 204C, 90-degree phases for the fourth and fifth loops 204D and 204E, 135-degree phase for the sixth loop 204F, and 180 degree phases for the seventh and eighth loops 204G and 204H. Such relative phases can be provided at least in part using a phase shifting circuit as shown illustratively in FIG. 3. Other relative phases between adjacent loops can be used. Generally, the relative phase between two laterally adjacent loops (such as between loops 204A and 204B, or between 204B and 204C, and so on, is a value other than ninety degrees. For example, the relative phase between the third and fourth loops 204C and 204D is 45 degree (because 204C is driven at 45 degrees and 204D is driven at 90 degrees, and accordingly there is a 45 degree phase difference). Other values can be used, such as depending at least in part on the angular position of a respective loop relative to the other loops. For example, the first loop 204A is driven at 0 degrees and the eighth loop 204H directly opposite the first loop is driven at 180 degrees relative to the first loop 204A.

Figure 3:
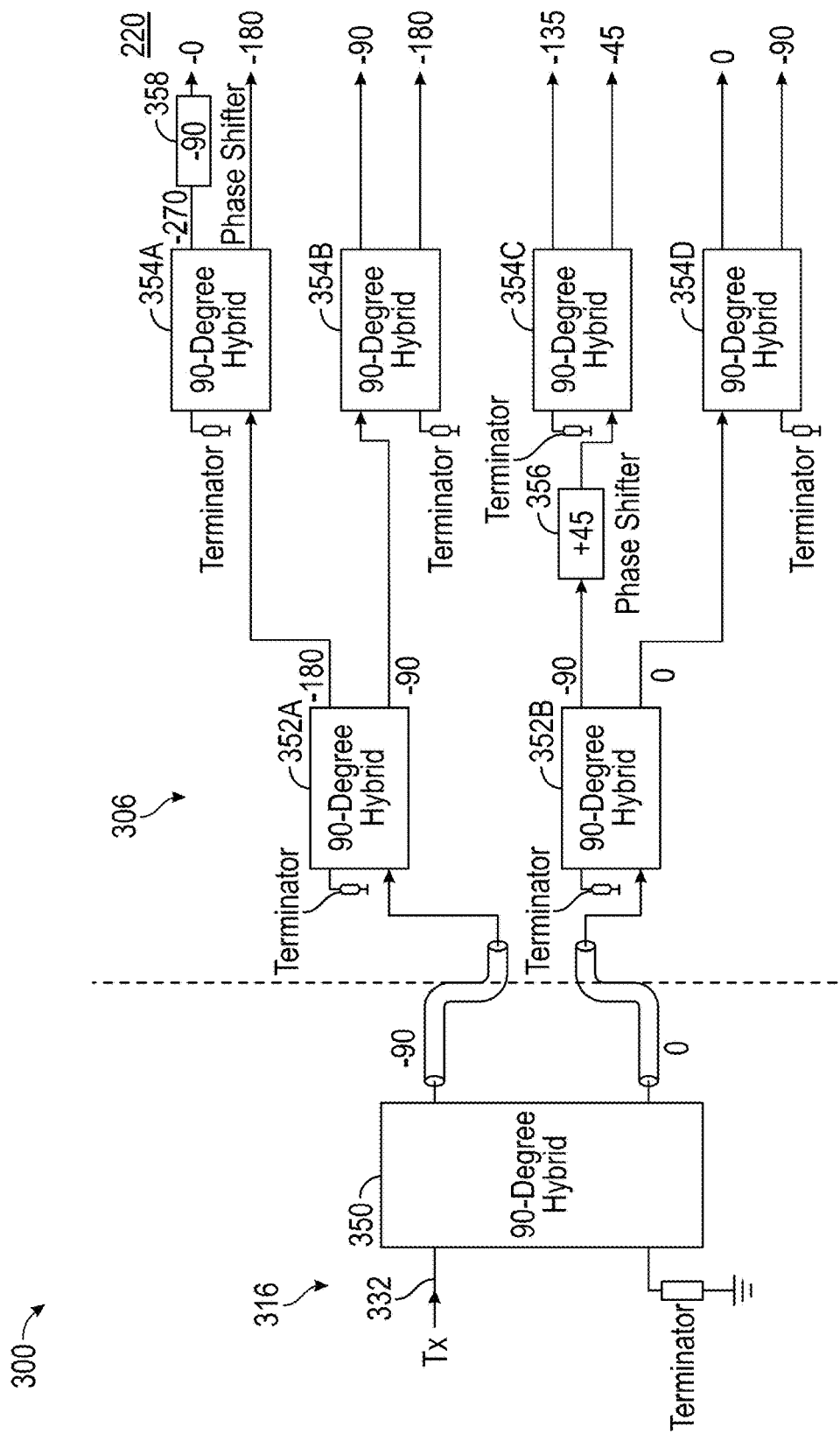
FIG. 3 illustrates generally an illustrative example of a phase shifting circuit, such as can include an array of 90-degree phase-shifting power splitters (e.g., hybrids).

FIG. 3 illustrates generally an illustrative example of a phase shifting circuit 300, such as can include an array of 90-degree phase-shifting power splitters (e.g., hybrids). A transmission source can include in-phase and quadrature outputs. For example, generally available MR imaging equipment can provide a transmission output circuit 316 such as can include a TX signal from a power amplifier coupled to a 90-degree power splitter such as a first hybrid 350. In-phase and quadrature outputs having a 90 degree relative phase can be provide, such as coupled via coaxial cables to inputs of a transmit phase shifting feed network 306. The phase shifting feed network can include an array of cascaded power splitters, such as a first echelon including first and second 90-degree hybrids 352A and 352B. A second echelon of splitters can be coupled to the outputs of the first echelon, such as including 90-degree hybrids 354A, 354B, 354C, and 354D, as in an illustrative example where eight transmit loops are separately driven. Other numbers of transmit loop channels can be used, such as can include using additional echelons of power splitters, or as can include terminating some unused outputs if a total count of transmit loops is not an integral power of two. One or more phase shifting elements such as a delay line or passive network can be included inline with one or more portions of the phase shifting feed network 306, such as can include a 45-degree phase shifter 356 or a 90-degree phase shifter 358. In this manner, phase shifters such as the 45-degree phase shifter 356 can be used in part to generate respective outputs amongst the outputs 220 having relative phases of other than 90 degrees with respect to other outputs. The outputs 220 can be coupled to the segmented loops such as shown illustratively in FIG. 2A or as modeled below in relation to FIGS. 4A and 4B, such as to provide laterally adjacent loops that have relative phase relationships that are other than 90 degrees.

Figure 4A:
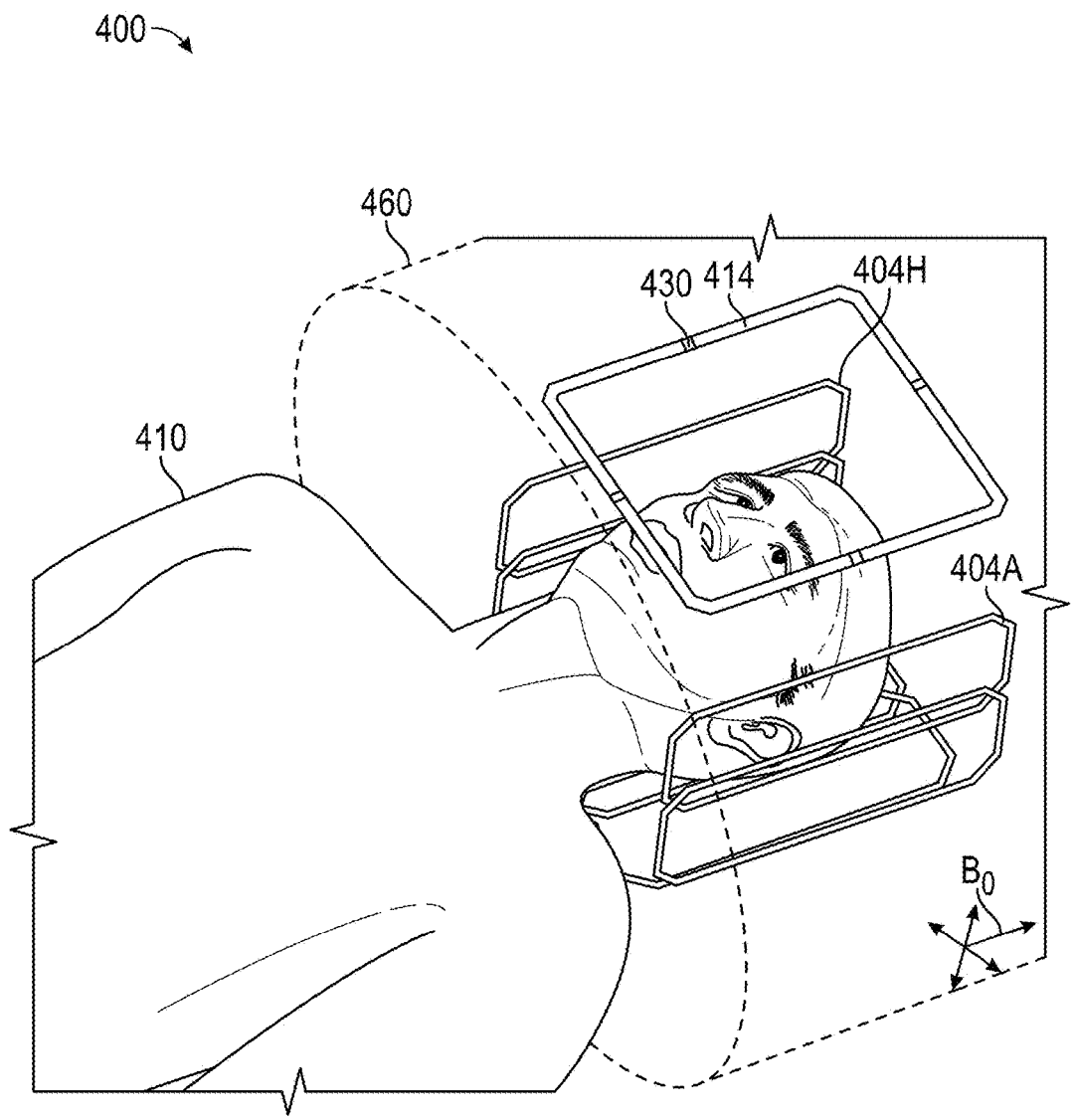
FIG. 4A and FIG. 4B illustrate generally views of an illustrative example of simulation model that can be used to estimate one or more of a field uniformity or a specific absorption ratio (SAR) corresponding to a transceiver coil arrangement as shown illustratively in FIG. 2A or 2B.
Figure 4B:
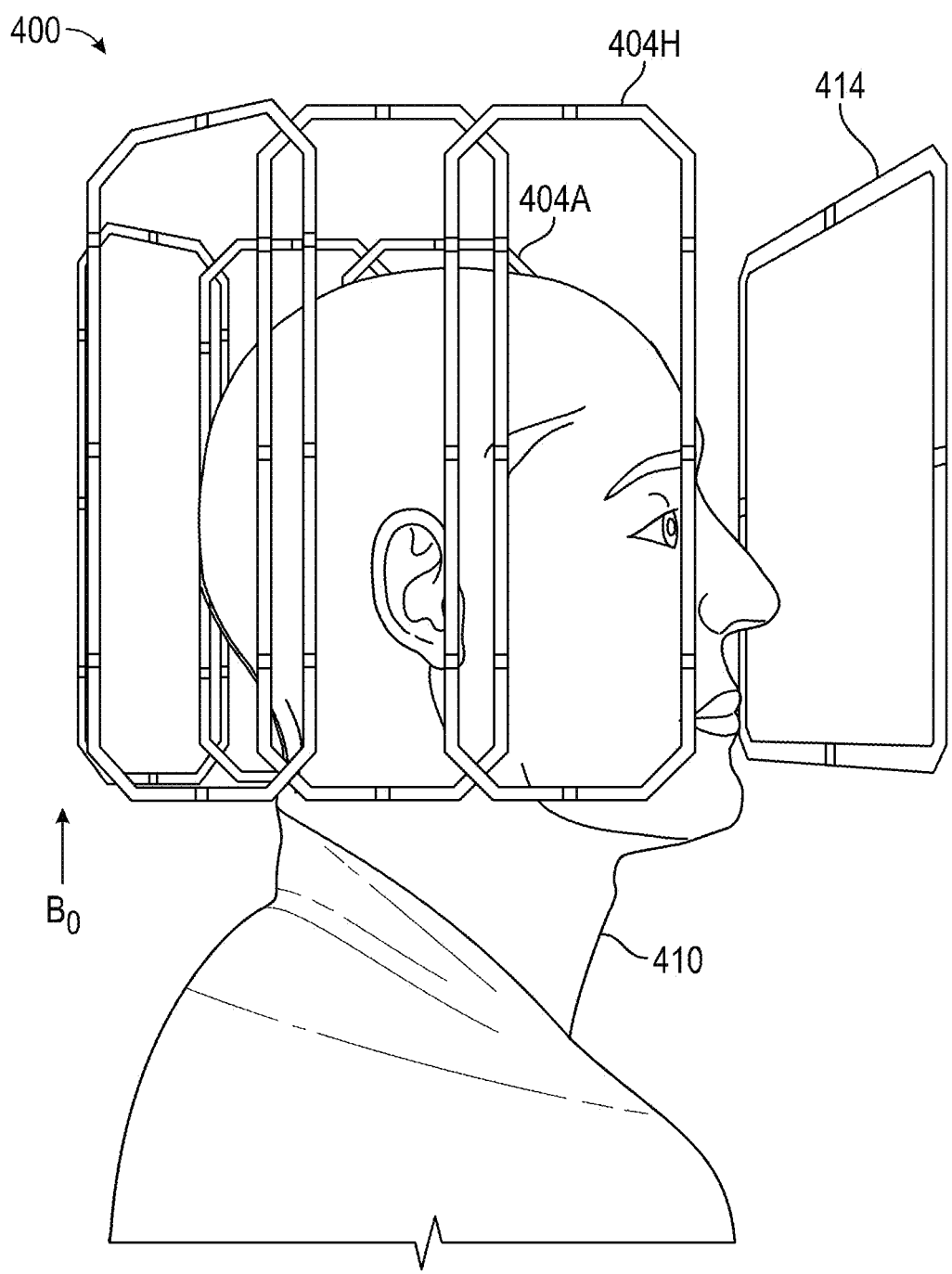

FIG. 4A and FIG. 4B illustrate generally views of an illustrative example of simulation model 400 that can be used to estimate one or more of a field uniformity or a specific absorption ratio (SAR) corresponding to a transceiver coil arrangement as shown illustratively in FIG. 2A or 2B. In the illustrative example of FIG. 4A and FIG. 4B an array of segmented electrical loops 404A through 404H can be arranged about at least a portion of an imaging subject 410. In the example of FIG. 4A and FIG. 4B, the imaging subject 410, and a volume-of-interest can include at least a portion of a head. The model 400 can include a separate loop 414, such as corresponding to a separate assembly optionally positionable over a portion of the imaging subject 410, such as opposite the array of loops 404A through 404H.

The model 400 of FIGS. 4A and 4B illustrates generally a transceiver coil arrangement that can be used as a portion of an MR imaging system. The transceiver coil arrangement shown in FIGS. 4A and 4B can be portable, and located nearby the imaging subject 410, such as corresponding to the example of the array 200B shown and described in relation to FIG. 2B. Such an arrangement can provide superior accessibility such as to facilitate pre-operative, intra-operative, or post-operative MR imaging protocols without disturbing a sterile field. Such a configuration is suitable for procedures such as can include MR-guided robotic assisted surgery, including craniotomy procedures in particular, for example.

In the illustrative example of FIG. 4A, each of the loops 204A through 204H can extend about 250 millimeters (mm) in length in the direction of the $B_0$ field axis (e.g., in a direction parallel to a longitudinal axis of a bore 460 defined by a bias magnet housing). Each of the loops 404A through 404H can be generally rectangular in shape as shown illustratively in FIG. 4A and FIG. 4B, such as having dimensions of about 250 mm by about 90 mm, or the loops can have other shapes or dimensions depending on the size and shape of the imaging subject. Portions or an entirety of the array of loops 404A through 404H can be deformable, such as to permit repositioning of the array to avoid interference with surgical access sites or other apparatus such as an HFD.

Overall, in the illustrative example of FIGS. 4A and 4B, the array can have dimensions of about 250 mm in the anterior-to-posterior direction, 250 mm in length distributed symmetrically about the imaging subject 410, and about 220 mm in width laterally across the imaging subject. Such a configuration in this illustrative example facilitates integration with a head fixation device. The separate assembly 414 (e.g., an anterior coil assembly in this example) can include a square-shaped loop having dimensions of about 210 mm by about 210 mm, such as inductively coupled to the array of segmented loops 404A through 404H. In this example of FIGS. 4A and 4B, the separate assembly 414 can also include a segmented structure, such as having one or more series capacitors (e.g., a capacitor 430), similar to other segmented loop examples described herein.

FIG. 5A, FIG. 5B, FIG. 5C, and FIG. 5D include illustrative examples of simulated normalized $B_1$ field magnitudes of a cross section of an imaging subject modeled as a heterogeneous dielectric phantom. The field magnitudes, which illustrate normalized field magnitudes referenced to $1.0 \times 10^{-6}$ T, show $B_1^+$ and $B_1^-$ rotational polarizations within a volume-of-interest for a model similar to the configuration shown in FIG. 4A and FIG. 4B, including examples having an array plus a separate coil assembly (e.g., FIG. 5B and FIG. 5D) as compared to an array lacking the separate coil assembly (e.g., FIG. 5A and FIG. 5C). The simulation results shown illustratively in FIG. 5A, FIG. 5B, FIG. 5C, and FIG. 5D were obtained using SEMCAD X (Ver. 14.6.1 Schmid & Partner Engineering AG, Zürich, Switzerland), and the imaging subject can be modeled using a tissue-mimicking dielectric phantom model (Duke University, Durham, N.C., U.S.A.).

Figure 5A:
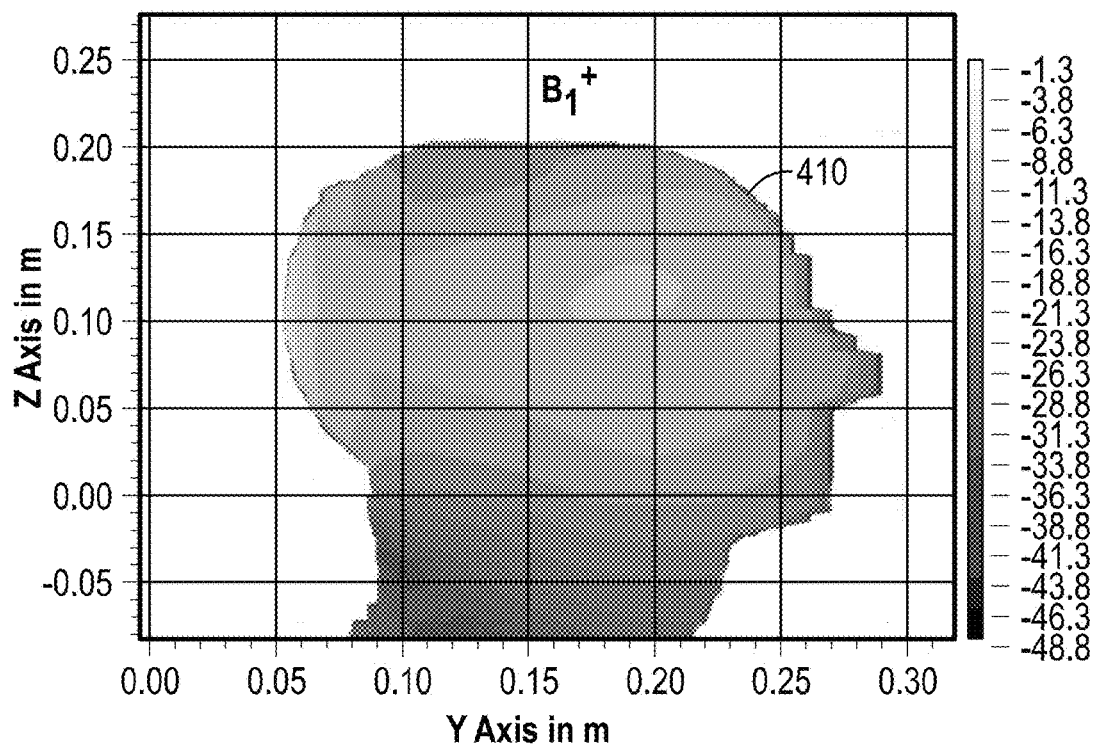
FIG. 5A, FIG. 5B, FIG. 5C, and FIG. 5D include illustrative examples of simulated normalized $B_1$ field magnitudes corresponding to $B_1^+$ and $B_1^-$ rotational polarizations within a volume-of-interest for a model similar to the configuration shown in FIG. 4A and FIG. 4B, including examples having an array plus a separate coil assembly (e.g., FIG. 5A and FIG. 5C) as compared to an array lacking the separate coil assembly (e.g., FIG. 5B and FIG. 5D).
Figure 5B:
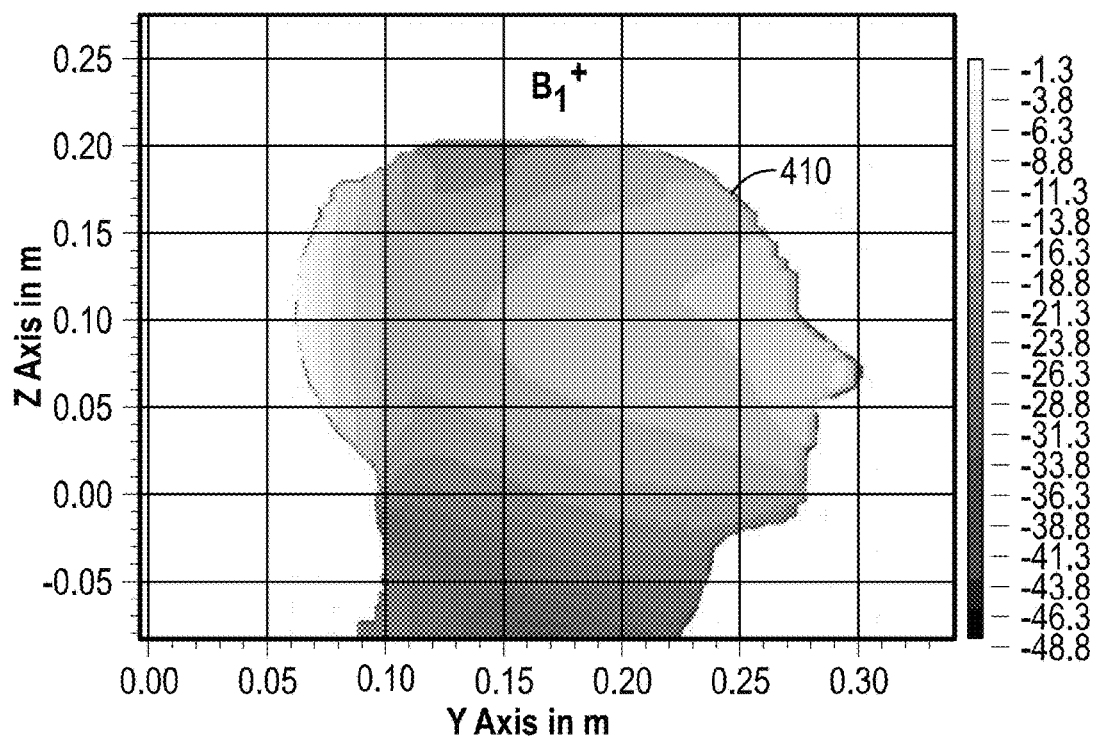
Figure 5C:
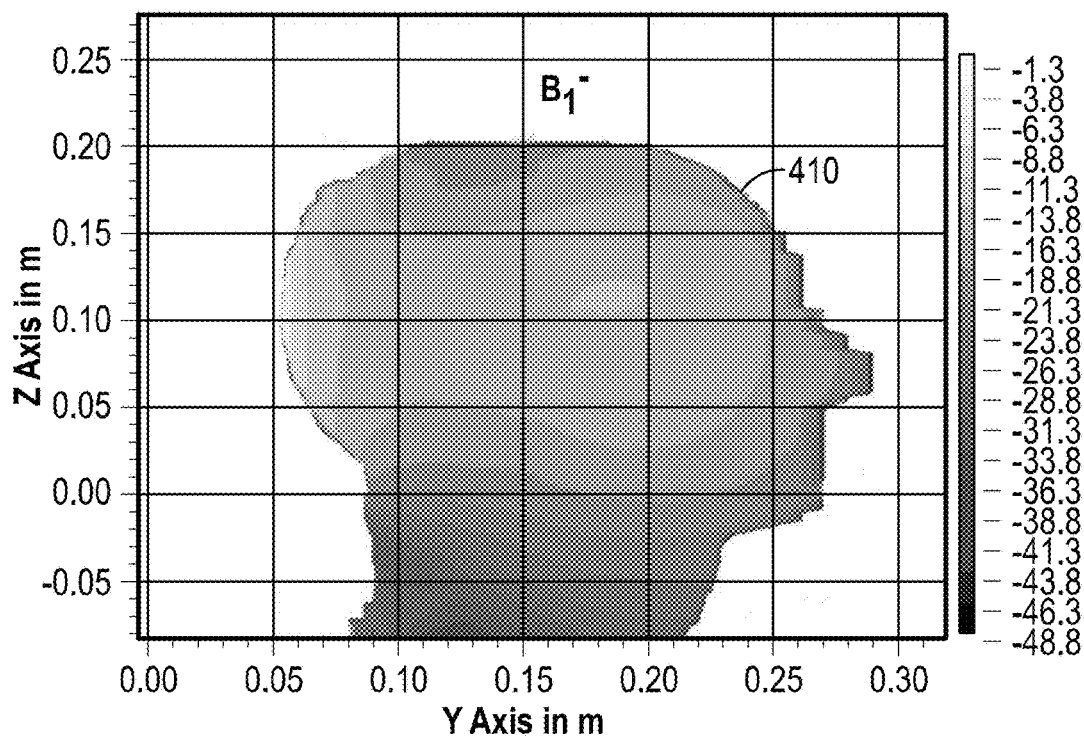
Figure 5D:
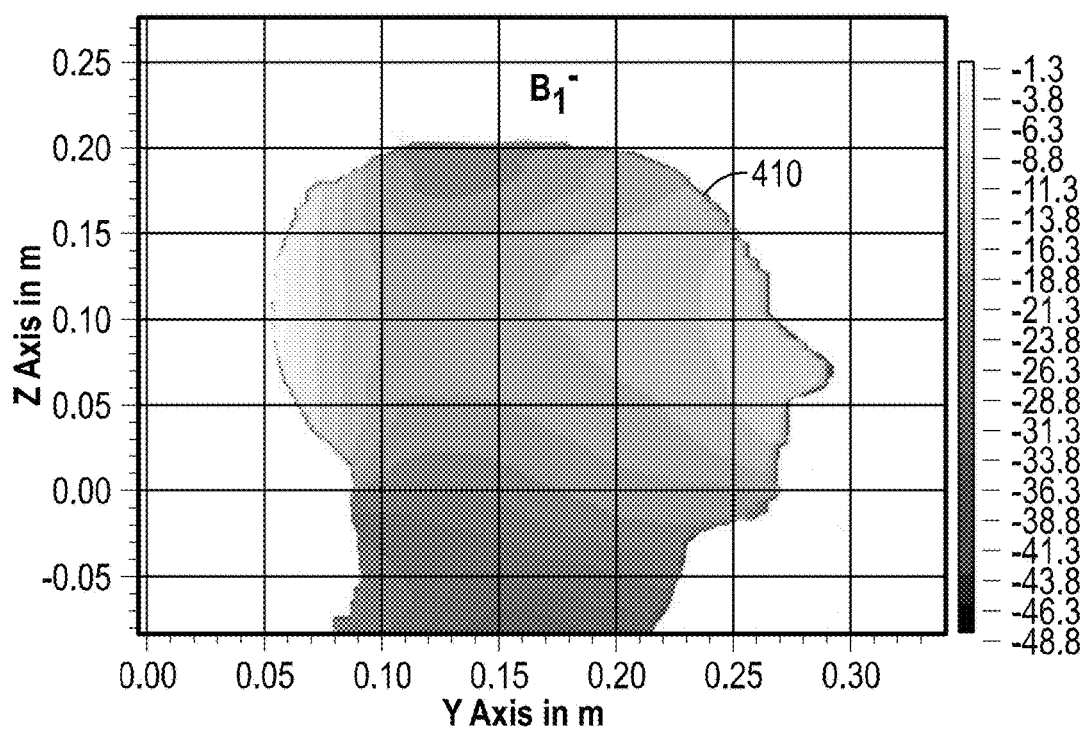

As indicated by the plots shown in 5A, FIG. 5B, FIG. 5C, and FIG. 5D, in simulation examples where the separate anterior coil assembly was present, the results indicate higher $B_1$ field magnitudes in the anterior region of the imaging subject, such as indicating heightened sensitivity when the separate anterior coil assembly was present, along with enhanced uniformity. However, even in the absence of the separate anterior coil assembly (e.g., the separate assembly 414 as shown in FIGS. 4A and 4B), a field magnitude is within about a 15-to-20 dB range within almost an entirety of the volume within the cranial region of the imaging subject above the chin line.

An illustrative example corresponding to examples of FIG. 2A, FIG. 2B, FIG. 4A, and FIG. 4B was constructed, with all loops tuned to 123.2 megahertz (MHz). A per-loop ratio of $Q_L$ to $Q_U$ (e.g., $Q_L/Q_H$) was measured to be about 8.5. The loops in the array (e.g., corresponding to loops 204A through 204H in FIG. 4A and FIG. 4B) were matched to 50 Ohms and geometrically decoupled, and greater than −15 dB isolation between laterally adjacent and next-laterally-adjacent loops was achieved.

Figure 5E:
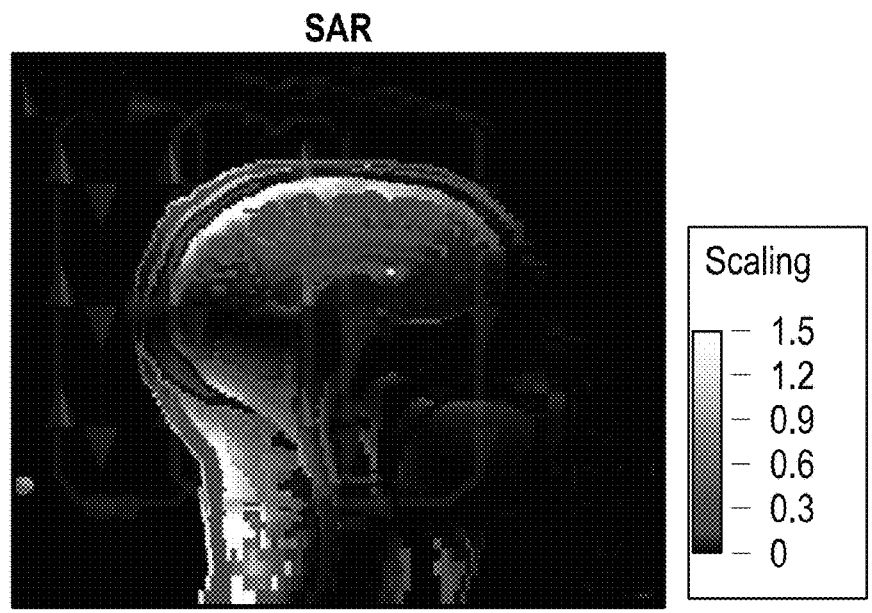
FIG. 5E and FIG. 5F include illustrative examples of simulated SAR values within a volume-of-interest for a model similar to the configuration shown in FIG. 4A and FIG. 4B, including examples having an array plus a separate coil assembly (e.g., FIG. 5F) as compared to an array lacking the separate coil assembly (e.g., FIG. 5E).
Figure 5F:
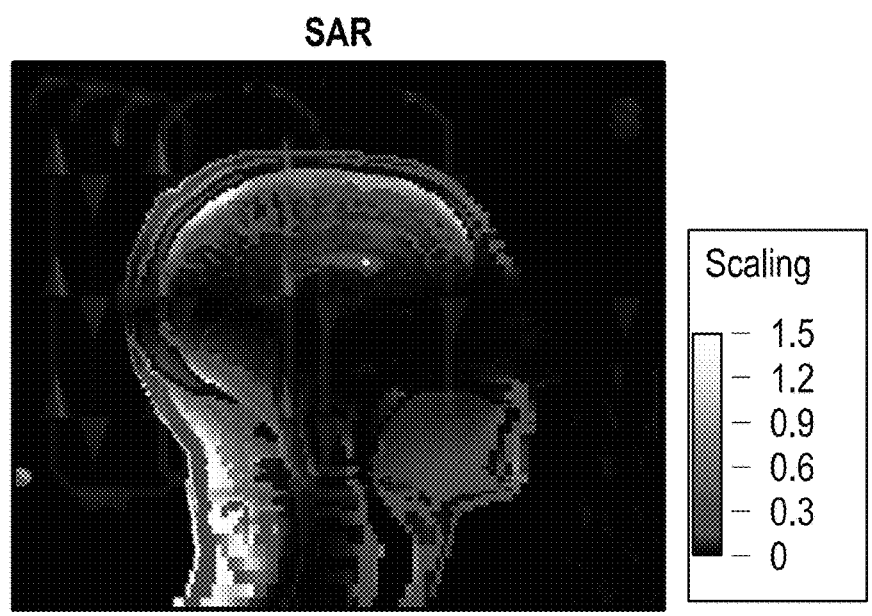

FIG. 5E and FIG. 5F include illustrative examples of simulated SAR values within a volume-of-interest for a model similar to the configuration shown in FIG. 4A and FIG. 4B, including examples having an array plus a separate coil assembly (e.g., FIG. 5F) as compared to an array lacking the separate coil assembly (e.g., FIG. 5E). According to the simulated SAR values shown in FIG. 5F, a presence of the separate anterior loop assembly does not significantly contribute to elevation of either localized or average SAR levels in the imaging subject. For example, a maximum value of 1.29 Watts per Kilogram (W/Kg) was induced in the cerebrospinal fluid region located on the occipital lobe, and a mean value is a much lower 0.052 W/Kg according to the simulation results of the illustrative examples shown in FIGS. 5E and 5F.

Figure 6A:
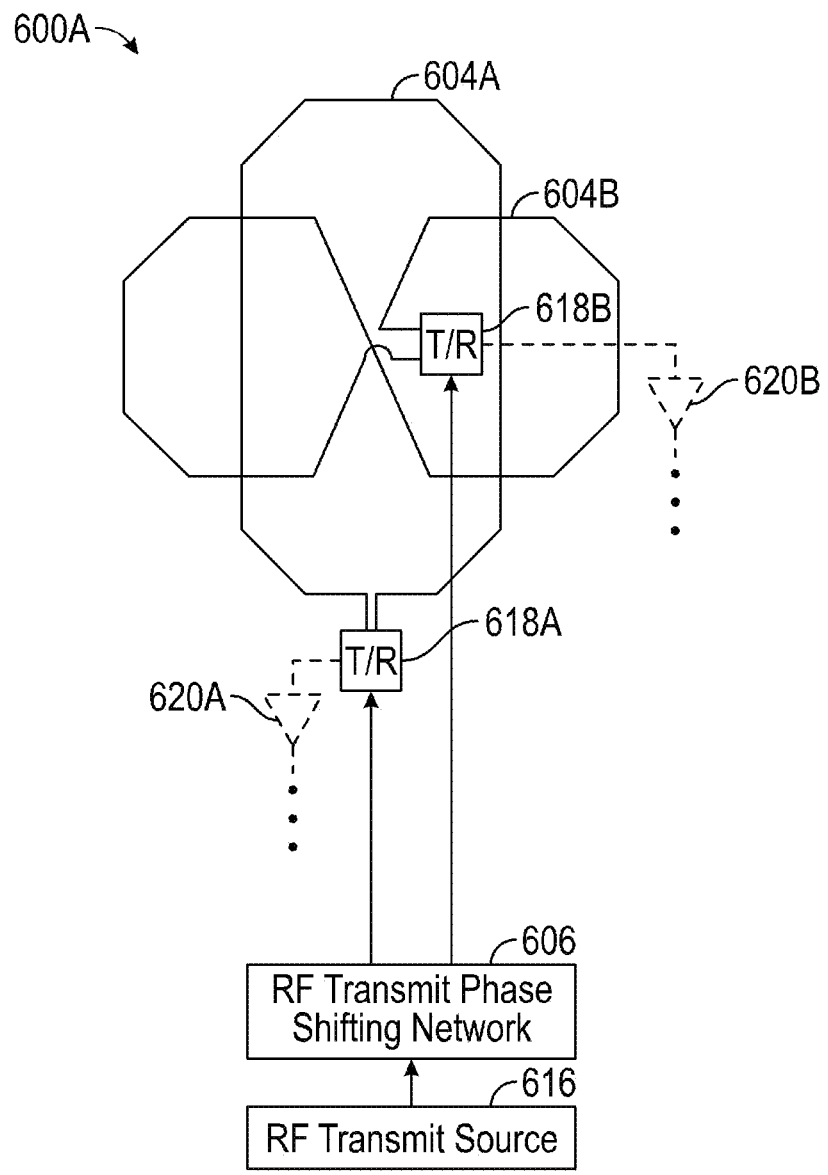
FIG. 6A illustrates generally an example of a transceiver coil arrangement that can include a stacked "butterfly" loop arrangement comprising two overlapping loop structures.
Figure 6B:
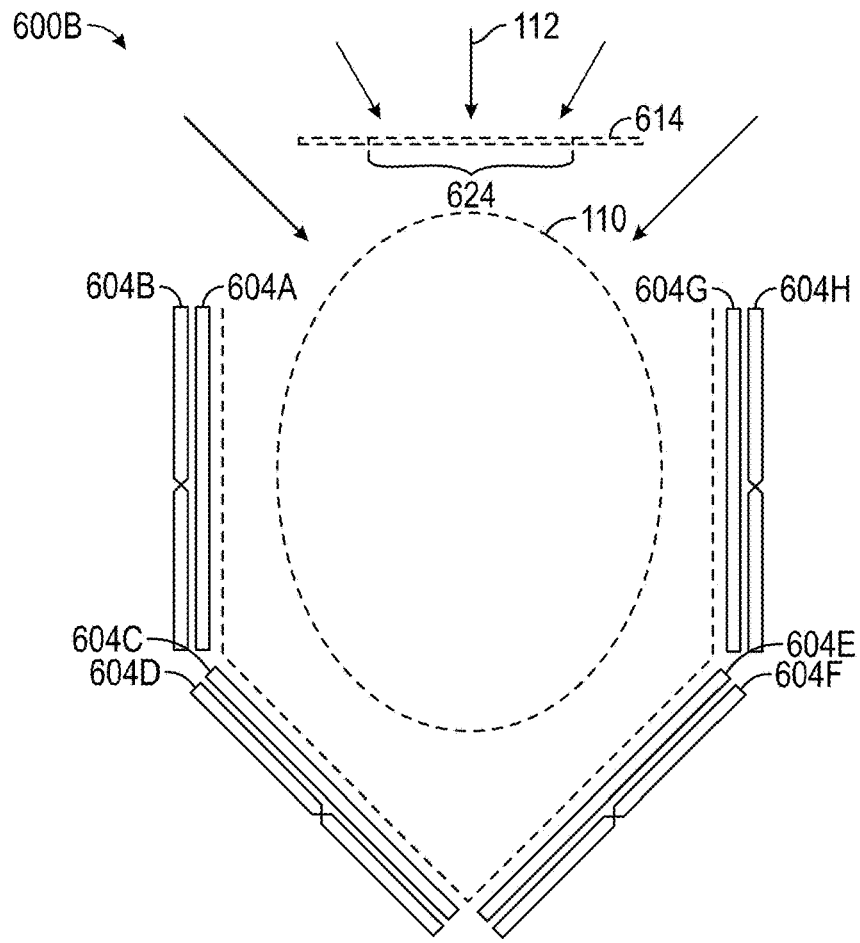
FIG. 6B illustrates generally an example of a transceiver coil arrangement comprising an array of butterfly loops such as including stacked loop structures as shown in FIG. 6A arranged about multiple sides of an imaging subject.

FIG. 6A illustrates generally an example of a transceiver coil arrangement 600A that can include a stacked "butterfly"

coil arrangement comprising two overlapping loop structures. A first loop 604A can be similar to the segmented loop structures described in other examples herein. A second loop 604B can be stacked upon the first loop 604A, but conductively isolated from the first loop 604A, such as having a butterfly or bow-tie arrangement as shown in FIG. 6A. Each of the first and second loops 604A and 604B can be coupled to an RF transmit phase shifting network 606, as described in other examples herein. The RF transmit phase shifting network can be coupled to an output of an RF transmit source 616. One or both of the loops 604A or 604B can include a port coupled to T/R switches 618A or 618B respectively, and in receive mode, one or both of the loops 604A or 604B can be coupled to receive channel preamplifiers 620A or 620B.

FIG. 6B illustrates generally an example of a transceiver coil arrangement 600B comprising an array of butterfly coils such as including stacked loop structures as shown in FIG. 6A arranged about multiple sides of an imaging subject 110. As in other examples described herein, the transceiver coil arrangement can include loops located about the imaging subject 110 (where such loops need not be restricted to perfectly planar structures. The arrangement 600B can include a first pair of stacked loops 604A and 604B can include driving the first loop 604A with a 0-degree phase, and the second loop 604B with a 90-degree phase relative to the first loop 604A. A third loop 604C, such as laterally adjacent to the first loop 604A, can be driven with a 45-degree phase relative to the first loop 604A, and a fourth loop 604D laterally adjacent to the second loop 604B can be driven with a 135-degree phase relative to the first loop 604A. Similarly, a fifth loop 604E can be driven with a 315-degree phase and a sixth loop 604F can be driven with a 225-degree phase, relative to the first loop 604A. A seventh loop 604G can be driven with a 180-degree phase, and an eight loop 604H can be driven with a 270-degree phase, relative to the first loop 604A. In this manner, a relative phase between any laterally-adjacent pair is other than ninety-degrees. The use of the first loop 604A to define the reference phase is illustrative, and the phases can be specified relative to another reference.

A phase shifting network similar to the example of FIG. 3 can be used to provide specified transmit phases to drive each of the loops 604A through 604H shown illustratively in FIG. 6B. As in other examples, while the illustration of FIG. 6B shows a piece-wise structure of planar loops, other examples can include curvature in one or more axes, and can include transmit phases other than those specified for this illustrative example. As in the example of FIG. 2B, a separate loop assembly 614, such as located in an anterior or posterior region of the imaging subject 110 can be used, such as to enhance one or more of imaging sensitivity or field uniformity. The separate assembly 614 can include an aperture 624, such as to permit surgical access to a side of the imaging subject in a region opposite the array, such as in a direction indicated by the arrow 112, or in other directions such as indicated by the other arrows.

Figure 7:
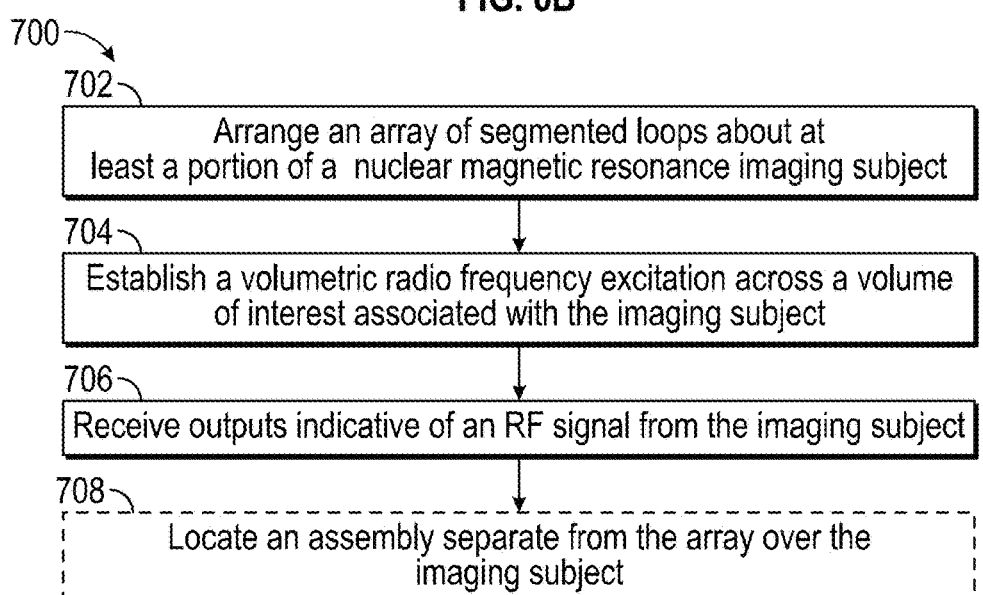
FIG. 7 illustrates generally a technique, such as a method, that can include arranging an array of segmented loops about at least a portion of a nuclear magnetic resonance imaging subject.

FIG. 7 illustrates generally a technique 700, such as a method, that can include, at 702, arranging an array of segmented loops about at least a portion of a nuclear magnetic resonance imaging subject. The array of segmented electrical loops can include an arrangement as shown in other examples herein, such as shown in the illustrative examples of FIG. 2B, FIG. 4A, FIG. 4B, or FIG. 6B. For example, the array of segmented loops can be arranged to include portions nearby the lateral regions of at least a portion of the imaging subject, along with a portion of the array located nearby one of an anterior or posterior regions of at least a portion of the imaging subject. As described in relation to other examples herein, the array can be present within or nearby a sterile field and can facilitate surgical access to a nuclear magnetic resonance imaging subject. For example, the array can be positioned about the imaging subject while still providing physical access to a region of the imaging subject from at least one direction, such as opposite one or more portions of the array of segmented electrical loops. At 704, such as during a portion of an MR imaging protocol, an array of segmented electrical loops can be used to establish a volumetric radio frequency excitation across a volume-of-interest associated with the imaging subject. In order to establish the uniform field, the segmented electrical loops can be driven with specified phases. For example, adjacent ones of the segmented electrical loops can be driven using a relative phase other than 90 degrees between the adjacent ones of the segmented electrical loops.

At 706, outputs can be received from one or more of the segmented electrical loops, such as for use in constructing an image, where the outputs are indicative of RF signals from the imaging subject. The received signals can be elicited by an RF excitation, where the RF excitation can be provided by the array or by a transmit coil located elsewhere. The open configuration of the array (e.g., not entirely encircling the imaging subject) can allow the array to remain in place for one or more of pre-operative, intra-operative, or post-operating MR imaging, such as to facilitate MR-guided procedures including stereotactic surgery, laser ablation, or robotic-assisted surgery such as neurosurgery.

Optionally, at 708, an assembly separate from the array can be located over the imaging subject, such as at a location opposite at least a portion of the array, such as shown and described in other examples herein. For example, the separate assembly can include an aperture to preserve or facilitate physical access to the imaging subject from a direction opposite the location of at least a portion of the array.

Various Notes & Examples

Example 1 can include or use subject matter (such as an apparatus, a method, a means for performing acts, or a device readable medium including instructions that, when performed by the device, can cause the device to perform acts), such as can include or use an array of segmented loops, the array arranged about a portion of a nuclear magnetic resonance imaging subject, the array of segmented loops arranged to provide surgical access to a region of the imaging subject from at least one direction. The segmented loops are configured to establish a volumetric radio frequency (RF) excitation field across a volume-of-interest associated with the imaging subject in response to the segmented loops receiving specified transmit phases providing a non-90-degree relative phase between segmented coil loops at adjacent ones of the segmented loops. At least some of the segmented loops are configured to provide outputs indicative of an RF signal from the imaging subject, the RF signal elicited in response to RF excitation.

Example 2 can include, or can optionally be combined with the subject matter of Example 1, to optionally include that the segmented loops are configured to establish a substantially uniform volumetric RF excitation field across a volume-of-interest in response to the segmented loops receiving specified transmit phases of the excitation signal from a phase shifting feed network, the specified phases corresponding at least in part to angular positions of the segmented coil loops within the array.

Example 3 can include, or can optionally be combined with the subject matter of one or any combination of Examples 1 or 2 to optionally include an assembly separate from the array, the assembly having a loop positionable over the the imaging subject opposite at least a portion of the array.

Example 4 can include, or can optionally be combined with the subject matter of Example 3, to optionally include that the assembly having the loop positionable over the imaging subject includes a housing defining an aperture within a center of the loop, the aperture permitting surgical access to the imaging subject.

Example 5 can include, or can optionally be combined with the subject matter of Example 4, to optionally include that the aperture includes an area of at least 100 square centimeters.

Example 6 can include, or can optionally be combined with the subject matter of one or any combination of Examples 3 through 5 to optionally include that the assembly having the loop is configured to receive energy wirelessly and to contribute to establishing the uniform volumetric radio frequency (RF) excitation field using at least a portion of the received energy.

Example 7 can include, or can optionally be combined with the subject matter of one or any combination of Examples 3 through 6 to optionally include that the assembly having the loop is configured to receive energy through a wired coupling and to contribute to establishing the uniform volumetric radio frequency (RF) excitation field using at least a portion of the received energy.

Example 8 can include, or can optionally be combined with the subject matter of one or any combination of Examples 1 through 7 to optionally include that the segmented loops define planes substantially parallel to a longitudinal axis of the imaging subject, the planes arranged about the imaging subject in lateral and one of anterior or posterior locations.

Example 9 can include, or can optionally be combined with the subject matter of one or any combination of Examples 1 through 8 to optionally include that the segmented loops are each configured to provide a respective output indicative of the RF signal from the imaging subject.

Example 10 can include, or can optionally be combined with the subject matter of one or any combination of Examples 1 through 9 to optionally include a phase shifting feed network including an array of 90-degree power splitters and one or more phase shifting circuits.

Example 11 can include, or can optionally be combined with the subject matter of one or any combination of Examples 1 through 10 to optionally include that the array of 90-degree power splitters comprises an array of cascaded hybrid couplers including a hybrid coupler having an output tap coupled to at least one 45-degree phase shifting circuit.

Example 12 can include, or can optionally be combined with the subject matter of one or any combination of Examples 1 through 11 to optionally include that at least a portion of the array of segmented loops is deformable into a desired configuration.

Example 13 can include, or can optionally be combined with the subject matter of one or any combination of Examples 1 through 12 to optionally include that the phases and relative orientations of the segmented loops are specified to decouple adjacent loops from each other.

Example 14 can include, or can optionally be combined with the subject matter of one or any combination of Examples 1 through 13 to optionally include that adjacent ones of the segmented loops laterally overlap with each other.

Example 15 can include, or can optionally be combined with the subject matter of one or any combination of Examples 1 through 14 to optionally include that the array is configured to one or more of transmit or receive energy during volumetric nuclear magnetic resonance imaging of the imaging subject in proximity to surgical apparatus.

Example 16 can include, or can optionally be combined with the subject matter of one or any combination of Examples 1 through 15 to optionally include that each of the segmented loops is coupled to an active transmit/receive (T/R) selector circuit, the T/R circuit configured to detune the segmented loops during transmission of an RF excitation pulse.

Example 17 can include, or can optionally be combined with the subject matter of one or any combination of Examples 1 through 16 to optionally include that the RF signal elicited in response to RF excitation includes an RF signal elicited in response to volumetric RF excitation transmitted by segmented loops of the array.

Example 18 can include, or can optionally be combined with the subject matter of one or any combination of Examples 1 through 17 to optionally include that the array is sized and shaped for location within a magnet bore of a nuclear magnetic resonance imaging apparatus, the magnet bore configured to establish a static magnetic field.

Example 19 can include, or can optionally be combined with the subject matter of one or any combination of Examples 1 through 18 to include, subject matter (such as an apparatus, a method, a means for performing acts, or a machine readable medium including instructions that, when performed by the machine, that can cause the machine to perform acts), such as can include an electrical transceiver coil system, comprising an array of segmented loops, the array arranged about three sides of at least a portion of a nuclear magnetic resonance imaging subject, the array of segmented loops arranged to provide surgical access to a region of the imaging subject from at least one direction. The segmented loops are configured to establish a volumetric radio frequency (RF) excitation field across a volume-of-interest associated with the imaging subject in response to the segmented loops receiving specified transmit phases providing a non-90-degree relative phase between segmented coil loops at adjacent ones of the segmented loops. At least some of the segmented loops are configured to provide outputs indicative of an RF signal from the imaging subject, the RF signal elicited in response to RF excitation. The segmented loops are arranged to establish a substantially uniform volumetric RF excitation field across a volume-of-interest in response to the segmented loops receiving specified transmit phases of the excitation signal from a phase shifting feed network, the specified phases corresponding to angular positions of the segmented coil loops within the array, the phase shifting feed network including an array of cascaded hybrid couplers, the array of cascaded hybrid couplers including a hybrid coupler having an output tap coupled to at least one 45-degree phase shifting circuit.

Example 20 can include, or can optionally be combined with the subject matter of Example 19, to optionally include an assembly separate from the array, the assembly having a loop positionable over a fourth side of the imaging subject.

Example 21 can include, or can optionally be combined with the subject matter of one or any combination of Examples 1 through 20 to include, subject matter (such as an apparatus, a method, a means for performing acts, or a machine readable medium including instructions that, when performed by the machine, that can cause the machine to perform acts), such as can include arranging an array of segmented electrical loops about a portion of a nuclear magnetic resonance imaging subject, the array of segmented electrical loops arranged to provide physical access to a region of the imaging subject from at least one direction, using the array of segmented electrical loops, establishing a volumetric radio frequency (RF) excitation field across a volume-of-interest associated with the imaging subject in response to the segmented electrical loops receiving specified transmit phases providing a non-90-degree relative phase between segmented electrical loops at adjacent ones of the segmented electrical loop, and providing outputs indicative of an RF signal from the imaging subject, the RF signal elicited in response to RF excitation.

Example 22 can include, or can optionally be combined with the subject matter of Example 21, to optionally include locating an assembly separate from the array over the fourth side of the imaging subject, the assembly including a loop positionable over the imagine subject opposite at least a portion of the array.

Example 23 can include, or can optionally be combined with the subject matter of Example 22, to optionally include receiving energy at the assembly separate from the array, and contributing to establishing the uniform volumetric radio frequency (RF) excitation field using at least a portion of the received energy and the positionable loop.

Example 24 can include, or can optionally be combined with the subject matter of one or any combination of Examples 21 through 23 to optionally include providing respective outputs at each of the segmented electrical loops, the respective outputs indicative of the RF signal from the imaging subject, the RF signal elicited in response to RF excitation.

Example 25 can include, or can optionally be combined with the subject matter of one or any combination of Examples 21 through 24 to optionally include arranging an array of segmented electrical loops about a portion of a nuclear magnetic resonance imaging subject within a magnet bore of a nuclear magnetic resonance imaging system, the magnet bore configured to establish a static magnetic field.

Example 26 can include, or can optionally be combined with any portion or combination of any portions of any one or more of Examples 1 through 25 to include, subject matter that can include means for performing any one or more of the functions of Examples 1 through 25, or a machine-readable medium including instructions that, when performed by a machine, cause the machine to perform any one or more of the functions of Examples 1 through 25.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electrical transceiver coil system, comprising:
a phase shifting feed network including an array of 90-degree power splitters and one or more phase shifting circuits; and
an array of segmented loops, the array arranged about a portion of a nuclear magnetic resonance imaging subject, the array of segmented loops arranged to provide surgical access to a region of the imaging subject from at least one direction radially opposite at least one of the segmented loops;
wherein at least some of the segmented loops are configured to provide outputs indicative of an RF signal from the imaging subject, the RF signal elicited in response to RF excitation; and
wherein the segmented loops are configured to establish a substantially uniform volumetric RF excitation field across a volume-of-interest in response to the segmented loops receiving specified transmit phases of the excitation signal from the phase shifting feed network, the specified phases corresponding at least in part to angular positions of the segmented coil loops within the array.

2. The electrical transceiver coil system of claim 1, wherein the segmented loops define planes substantially parallel to a longitudinal axis of the imaging subject, the planes arranged about the imaging subject in lateral and one of anterior or posterior locations.

3. The electrical transceiver coil system of claim 1, wherein the segmented loops are each configured to provide a respective output indicative of the RF signal from the imaging subject.

4. The electrical transceiver coil system of claim 1, wherein the array of 90-degree power splitters comprises an array of cascaded hybrid couplers including a hybrid coupler having an output tap coupled to at least one 45-degree phase shifting circuit.

5. The electrical transceiver coil system of claim 1, wherein at least a portion of the array of segmented loops is deformable into a desired configuration.

6. The electrical transceiver coil system of claim 1, wherein the phases and relative orientations of the segmented loops are specified to decouple adjacent loops from each other.

7. The electrical transceiver coil system of claim 1, wherein adjacent ones of the segmented loops laterally overlap with each other.

8. The electrical transceiver coil system of claim 1, wherein the array is configured to one or more of transmit or receive energy during volumetric nuclear magnetic resonance imaging of the imaging subject in proximity to surgical apparatus.

9. The electrical transceiver coil system of claim 1, wherein each of the segmented loops is coupled to an active transmit/receive (T/R) selector circuit, the T/R circuit configured to detune the segmented loops during transmission of an RF excitation pulse.

10. The electrical transceiver coil system of claim 1, wherein the RF signal elicited in response to RF excitation includes an RF signal elicited in response to volumetric RF excitation transmitted by segmented loops of the array.

11. The electrical transceiver coil system of claim 1, wherein the array is sized and shaped for location within a magnet bore of a nuclear magnetic resonance imaging apparatus, the magnet bore configured to establish a static magnetic field.

12. An electrical transceiver coil system, comprising:
an array of segmented loops, the array arranged about three sides of at least a portion of a nuclear magnetic resonance imaging subject, the array of segmented loops arranged to provide surgical access to a region of the imaging subject from at least one direction radially opposite at least one of the segmented loops;
wherein the segmented loops are configured to establish a volumetric radio frequency (RF) excitation field across a volume-of-interest associated with the imaging subject in response to the segmented loops receiving specified transmit phases providing a non-90-degree relative phase between segmented coil loops at adjacent ones of the segmented loops;
wherein at least some of the segmented loops are configured to provide outputs indicative of an RF signal from the imaging subject, the RF signal elicited in response to RF excitation; and
wherein the segmented loops are arranged to establish a substantially uniform volumetric RF excitation field across a volume-of-interest in response to the segmented loops receiving specified transmit phases of the excitation signal from a phase shifting feed network, the specified phases corresponding to angular positions of the segmented coil loops within the array, the phase shifting feed network including an array of cascaded hybrid couplers, the array of cascaded hybrid couplers including a hybrid coupler having an output tap coupled to at least one 45-degree phase shifting circuit.

13. The electrical transceiver coil system of claim 12, comprising an assembly separate from the array, the assembly having a loop positionable over a fourth side of the imaging subject.

14. A method, comprising:
arranging an array of segmented electrical loops about a portion of a nuclear magnetic resonance imaging subject, the array of segmented electrical loops arranged to provide physical access to a region of the imaging subject from at least one direction radially opposite at least one of the segmented loops;
using the array of segmented electrical loops, establishing a volumetric radio frequency (RF) excitation field across a volume-of-interest associated with the imaging subject in response to the segmented electrical loops receiving specified transmit phases providing a non-90-degree relative phase between segmented electrical loops at adjacent ones of the segmented electrical loops; and
providing outputs indicative of an RF signal from the imaging subject, the RF signal elicited in response to RF excitation;
wherein the segmented loops are configured to establish a substantially uniform volumetric RF excitation field across the volume-of-interest in response to the segmented loops receiving specified transmit phases of the excitation signal from a phase shifting feed network, the specified phases corresponding at least in part to angular positions of the segmented coil loops within the array, and the phase shifting feed network including an array of 90-degree power splitters and one or more phase shifting circuits.

15. The method of claim 14, comprising locating an assembly separate from the array over a fourth side of the imaging subject, the assembly including a loop positionable over the imagine subject opposite at least a portion of the array.

16. The method of claim 15, comprising:
receiving energy at the assembly separate from the array; and
contributing to establishing the uniform volumetric radio frequency (RF) excitation field using at least a portion of the received energy and the positionable loop.

17. The method of claim 14, comprising providing respective outputs at each of the segmented electrical loops, the respective outputs indicative of the RF signal from the imaging subject, the RF signal elicited in response to RF excitation.

18. The method of claim 14, comprising
arranging the array of segmented electrical loops about a portion of a nuclear magnetic resonance imaging subject within a magnet bore of a nuclear magnetic resonance imaging system, the magnet bore configured to establish a static magnetic field.

19. An electrical transceiver coil system, comprising:
an array of segmented loops, the array arranged about a portion of a nuclear magnetic resonance imaging subject, the array of segmented loops arranged to provide surgical access to a region of the imaging subject from at least one direction radially opposite at least one of the segmented loops;
an assembly separate from the array, the assembly having a loop positionable over the imaging subject opposite at least a portion of the array, and the assembly including a housing defining an aperture within a center of the loop, the aperture permitting surgical access to the imaging subject;
wherein the segmented loops are configured to establish a volumetric radio frequency (RF) excitation field across a volume-of-interest associated with the imaging subject in response to the segmented loops receiving specified transmit phases providing a non-90-degree relative phase between segmented coil loops at adjacent ones of the segmented loops; and
wherein at least some of the segmented loops are configured to provide outputs indicative of an RF signal from the imaging subject, the RF signal elicited in response to RF excitation; and
wherein the assembly having the loop is configured to receive energy and to contribute to establishing the uniform volumetric radio frequency (RF) excitation field using at least a portion of the received energy.

20. The electrical transceiver coil system of claim 19, comprising a phase shifting feed network including an array of 90-degree power splitters and one or more phase shifting circuits;
wherein the segmented loops are configured to establish a substantially uniform volumetric RF excitation field across the volume-of-interest in response to the segmented loops receiving specified transmit phases of the excitation signal from the phase shifting feed network, the specified phases corresponding at least in part to angular positions of the segmented coil loops within the array.

21. The electrical transceiver coil system of claim 20, wherein the array of 90-degree power splitters comprises an array of cascaded hybrid couplers including a hybrid coupler having an output tap coupled to at least one 45-degree phase shifting circuit.

22. The electrical transceiver coil system of claim 19, wherein the assembly having the loop is configured to receive energy wirelessly and to contribute to establishing the uniform volumetric radio frequency (RF) excitation field using at least a portion of the received energy.

23. The electrical transceiver coil system of claim 19, wherein the assembly having the loop is configured to receive energy through a wired coupling and to contribute to establishing the uniform volumetric radio frequency (RF) excitation field using at least a portion of the received energy.

24. The electrical transceiver coil system of claim 19, wherein the segmented loops define planes substantially parallel to a longitudinal axis of the imaging subject, the planes arranged about the imaging subject in lateral and one of anterior or posterior locations.

25. The electrical transceiver coil system of claim 19, wherein the segmented loops are each configured to provide a respective output indicative of the RF signal from the imaging subject.

26. The electrical transceiver coil system of claim 19, wherein adjacent ones of the segmented loops laterally overlap with each other.

27. The electrical transceiver coil system of claim 19, wherein the array is configured to one or more of transmit or receive energy during volumetric nuclear magnetic resonance imaging of the imaging subject in proximity to surgical apparatus.

28. The electrical transceiver coil system of claim 19, wherein the array is sized and shaped for location within a magnet bore of a nuclear magnetic resonance imaging apparatus, the magnet bore configured to establish a static magnetic field.

* * * * *